United States Patent [19]

Wicker et al.

[11] Patent Number: 5,556,831

[45] Date of Patent: Sep. 17, 1996

[54] METHOD OF TREATING A PART MADE OF A SUPERCONDUCTIVE CERAMIC OF THE $(LN)_1BA_2CU_3O_{7-\delta}$ TYPE

[75] Inventors: Alain Wicker, Paris; Jean-Pierre Bonnet, Carignan; Mariano Sanz, Leognan; Patrice Dordor; Christophe Magro, both of Bordeaux, all of France

[73] Assignee: Alactel Alsthom Compagnie Generale d'Electricite, Paris Cedex, France

[21] Appl. No.: 263,411

[22] Filed: Jun. 21, 1994

Related U.S. Application Data

[63] Continuation of Ser. No. 980,701, Nov. 24, 1992, abandoned.

[30] Foreign Application Priority Data

Nov. 29, 1991 [FR] France ................................. 9114805

[51] Int. Cl.$^6$ ........................ H01L 39/12; C04B 35/45; C04B 35/50; C04B 35/64
[52] U.S. Cl. ........................ 505/500; 505/126; 505/480; 505/778; 505/780; 505/815; 505/742; 505/779; 505/490
[58] Field of Search ........................ 252/521; 505/126, 505/500, 480, 778, 780, 815, 742, 779, 490

[56] References Cited

U.S. PATENT DOCUMENTS

| | | | |
|---|---|---|---|
| 4,929,598 | 5/1990 | Bagley et al. | 505/1 |
| 5,140,005 | 8/1992 | Rangaswamy et al. | 505/780 X |
| 5,196,400 | 3/1993 | Chen et al. | 505/476 |
| 5,432,150 | 7/1995 | Zhou | 505/500 X |

FOREIGN PATENT DOCUMENTS

| | | | |
|---|---|---|---|
| 028418 | 9/1988 | European Pat. Off. | |
| 0148712 | 6/1989 | Japan | 505/742 |
| 0199807 | 8/1990 | Japan | 505/742 |
| 9013132 | 11/1990 | WIPO | |

OTHER PUBLICATIONS

Chemical Abstracts, CA 115:195669 (1991 month not known).

Lindemer, T. B., et al., "Experimental and Thermodynamic Study of Nonstichiometry in $(YBa_2Cu_3O_{7-x})$", *J. Am. Ceram. Soc.*, 72(10) (1989 month not known) 1775–88.

Davidson, A., et al., "Conduction and Hall Measurements of $Ba_2YCu_3O_{6+\delta}$ films at High Temperatures", *Physical Review B*, 38(4) (1 Aug. 88) 2828–31.

Khachaturyan A. G., "Phase diagram of the superconducting oxide $YB_2Cu_3O_{6-\delta}$", *Physical Review B.*, 37(4) (1 Feb. 88) 2243–6.

Patent Abstracts of Japan, vol. 014, No. 270 (C–727) Jun. 12, 1990 & JP–A–02 080 302 (Teijin Ltd.) Mar. 20, 1990.

World Patents Index Latest, Week 8938, Derwent Publications Ltd., London, Great Britian; AH 89–274998(38) & JP–A–1 201 008 (Fujikura Cable Works KK) Aug. 14, 1989.

Tamura, H., et al, "Effects of Surface Treatments on $Ba_2YCu_3O_{7-y}$", *High–Temperature Superconductors II*, Materials Research Society, Apr. 5–9, 1988, pp. 117–120.

*Primary Examiner*—Douglas J. McGinty
*Attorney, Agent, or Firm*—Sughrue, Mion, Zinn, Macpeak & Seas

[57] ABSTRACT

A method of treating a part made of a superconductive ceramic of the $(Ln)_1Ba_2Cu_3O_{7-\delta}$ type, where Ln is chosen from the rare earth elements other than cerium and terbium, the method being designed to reduce the value of $\delta$, in which method said part is heat treated in an oxidizing atmosphere, said method being wherein, during said treatment, an electric current with a density lying in the range 0.1 A/cm$^2$ to 2 A/cm$^2$ is caused to flow through said part, said treatment atmosphere having a partial pressure of oxygen lying in the range 0.1 atmospheres to 1 atmosphere, the treatment temperature lying in the range 200° C. to 500° C., and the duration of said treatment lying in the range 1 hour to 200 hours.

2 Claims, No Drawings

METHOD OF TREATING A PART MADE OF A SUPERCONDUCTIVE CERAMIC OF THE $(LN)_1BA_2CU_3O_{7-\delta}$ TYPE This is a Continuation of Application Ser. No. 07/980, 701 filed Nov. 24,1992, now abandoned.

The present invention relates to a method of treating a part made of a superconductive ceramic of the $(Ln)_1Ba_2Cu_3O_{7-\delta}$ type, where Ln is chosen from the rare earth elements other than cerium and terbium, and it relates in particular to an oxidation method.

BACKGROUND OF THE INVENTION

Currently, a part made of a sintered ceramic is re-oxidized by being treated in oxygen at low temperature (about 450° C.), or else the part is cooled very slowly in oxygen just after it has been sintered.

The article by N. Mc. N. Alford et al published in Nature vol. 332, on Mar. 3, 1988, pages 58–59, indicates that the current density that can be passed through a part made of a ceramic, such as $YBa_2Cu_3O_{7-\delta}$, depends to a large extent on the oxygen content. The authors advocate making $\delta$ as close as possible to zero.

The article by T. B. Lindemer et al published in the J. Am. Ceram. Soc. 72 (10) 1775 88 (1989) specifies the relationships between $\delta$ and various treatment parameters such as temperature and the partial pressure of oxygen in the atmosphere used. It would seem possible to achieve values for $\delta$ not greater than 0.01, by means of treatment in oxygen at temperatures of less than 400° C., if thermodynamic equilibrium is reached. But thermodynamic equilibrium can only be reached after a very long time.

The publication by J. M. Heintz et al in J. Less Common Metals 164–165 (1990) p. 337 shows that there are diffusion barriers at the interfaces between the grains of the ceramic, and this considerably reduces oxidation speeds. The authors propose increasing the kinetics and the diffusion by increasing the temperature. But, in pure oxygen at 500° C., values for $\delta$ are obtained that are greater than or equal to 0.03.

An object of the present invention is to provide a method of treatment that enables oxygen diffusion to be activated and the value of $\delta$ to be reduced with treatment of reasonable duration.

SUMMARY OF THE INVENTION

The present invention provides a method of treating a part made of a superconductive ceramic of the $(Ln)_1Ba_2Cu_3O_{7-\delta}$ type, where Ln is chosen from the rare earth elements other than cerium and terbium, the method being designed to reduce the value of $\delta$, in which method said part is heat treated in an oxidizing atmosphere, wherein during said treatment, an electric current with a density lying in the range 0.1 A/cm$^2$ to 2 A/cm$^2$ is caused to flow through said part, said treatment atmosphere having a partial pressure of oxygen lying in the range 0.1 atmospheres to 1 atmosphere, the treatment temperature lying in the range 200° C. to 500° C., and the duration of said treatment lying in the range 1 hour to 200 hours.

Preferably, said temperature lies in the range 350° C. to 450° C. and said duration lies in the range 12 hours to 48 hours.

Advantageously, Ln is yttrium.

Other characteristics and advantages of the present invention will appear on reading the following description of embodiments given by way of example.

DETAILED DESCRIPTION

EXAMPLE 1

A mixture was made of the following in powder form: $Y_1Ba_2Cu_3O_{7-\delta}$, $Y_2Ba_1Cu_1O_5$ (5% molar) and CuO (5% molar).

The mixture was compressed when cold and the resulting pellet was heated to 1,195° C. for 10 minutes, and then cooled quickly to 1,040° C. It was then cooled slowly to ambient temperature, and all this was done in pure oxygen.

A rectangular block shaped sample of dimensions 8 mm×5 mm×15 mm was cut out. The oxygen content was analyzed by making a solution of a small fragment of the sample and assaying the $Cu^{3+}$ ion content. The result was $\delta=35.10^{-3}$ and Tc=91.6 K (measurement of magnetic susceptibility).

The remainder of the sample was fitted with electrical contacts based on a platinum varnish baked at 900° C. in oxygen. In accordance with the invention the sample was subjected to heat treatment for 25 hours at 450° C. in oxygen by applying a DC current of 100 mA (i.e. about 0.5 A/cm$^2$). As before, $\delta$ was then measured, and the result was $\delta=13.10^{-3}$ and Tc=92.4 K.

EXAMPLE 2

A mixture was made of the following in powder form: $Y_1Ba_2Cu_3O_{7-\delta}$ and CuO (5% molar). The same cycle as in example 1 was performed to obtain a rectangular block shaped sample. The sample was subjected to heat treatment in oxygen for 30 hours at 400° C. The result was $\delta=25.10^{-3}$ and Tc=91.7 K. In accordance with the invention, after fitting electrical contacts (as in example 1), a 50 Hz AC current of 100 mA (about 0.5 A/cm$^2$) was applied for 30 hours at 400° C. under a partial pressure of oxygen of 0.2 atm. The result was $\delta=15.10^{-3}$ and Tc=92.1 K.

Naturally, the invention is not limited to the above-described embodiments. In particular, yttrium may be replaced by any other rare earth element, except for cerium and terbium.

We claim:

1. A method of reducing the value of $\delta$ during final thermal oxygenation of a superconductor compressed powder ceramic part of the $(LN)_1Ba_2Cu_3O_{7-\delta}$ formula, where Ln is chosen from the rare earth elements other than cerium and terbium, said method comprising:

heat treating said part in an oxidizing atmosphere at a partial pressure of oxygen lying in the range of 0.1 atmospheres to 1 atmosphere, at a temperature lying in the range of 350° C. to 450° C. and for a duration of 12 to 48 hours, and during said heat treating step, in order to activate the oxygen diffusion in said part, causing an electric current to flow through said part with a current density lying in the range of 0.1 A/cm$^2$ to 2 A/cm$^2$.

2. A method according to claim 1, wherein Ln is yttrium.

* * * * *